(12) United States Patent
Lee

(10) Patent No.: US 10,505,560 B2
(45) Date of Patent: Dec. 10, 2019

(54) ANALOG-TO-DIGITAL CONVERTER WITH NOISE ELIMINATION

(71) Applicant: MEDIATEK INC., Hsin-Chu (TW)

(72) Inventor: Fong-Wen Lee, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/000,350

(22) Filed: Jun. 5, 2018

(65) Prior Publication Data

US 2019/0089366 A1 Mar. 21, 2019

Related U.S. Application Data

(60) Provisional application No. 62/558,892, filed on Sep. 15, 2017.

(51) Int. Cl.
*H03M 1/06* (2006.01)
*H03M 1/12* (2006.01)
(Continued)

(52) U.S. Cl.
CPC ............ *H03M 1/0614* (2013.01); *H03F 1/26* (2013.01); *H03F 3/45475* (2013.01);
(Continued)

(58) Field of Classification Search
CPC ..... H03M 1/0614; H03M 1/08; H03M 1/1245
(Continued)

(56) References Cited

U.S. PATENT DOCUMENTS 5,047,665 A 9/1991 Burt
5,068,660 A 11/1991 Swanson et al.
(Continued)

FOREIGN PATENT DOCUMENTS

CN 104375164 A 2/2015
CN 104410418 A 3/2015
(Continued)

OTHER PUBLICATIONS

Malcher, A., et al.; "Single-ended to differential converters based on operational amplifiers: Performance analysis and design tips;" Przeglad Elektrotechniczny; ISSN; Mar. 2017; pp. 287-293.

*Primary Examiner* — Brian K Young
(74) *Attorney, Agent, or Firm* — McClure, Qualey & Rodack, LLP

(57) ABSTRACT

An analog-to-digital converter with noise elimination is disclosed. The analog-to-digital converter converts a single-ended analog input into digital representation, and comprises an input buffer and an analog-to-digital conversion module. The input buffer outputs a positive differential signal and a negative differential signal based on the single-ended analog input. The analog-to-digital conversion module receives the positive differential signal and the negative differential signal to generate the digital representation. The input buffer further transmits a noise compensation signal to the analog-to-digital conversion module. The noise compensation signal contains noise information about noise transmitted from the input buffer to the analog-to-digital conversion module through the positive differential signal and the negative differential signal. The analog-to-digital conversion module uses the noise compensation signal to compensate for the noise transmitted from the input buffer to the analog-to-digital conversion module through the positive differential signal and the negative differential signal.

17 Claims, 5 Drawing Sheets

(51) Int. Cl.
*H03M 1/08* (2006.01)
*H03F 1/26* (2006.01)
*H03F 3/45* (2006.01)
*H03M 1/46* (2006.01)
*H03M 3/00* (2006.01)

(52) U.S. Cl.
CPC ............ *H03M 1/08* (2013.01); *H03M 1/124* (2013.01); *H03M 1/1245* (2013.01); *H03M 1/468* (2013.01); *H03M 3/458* (2013.01)

(58) Field of Classification Search
USPC .................................................. 341/155, 118
See application file for complete search history.

(56) References Cited

U.S. PATENT DOCUMENTS

| | | | |
|---|---|---|---|
| 5,410,270 A | 4/1995 | Rybicki et al. | |
| 6,433,724 B1 * | 8/2002 | Confalonieri | H03M 1/068 |
| | | | 341/155 |
| 6,972,705 B1 * | 12/2005 | Fei | H03M 3/39 |
| | | | 341/143 |
| 7,227,481 B2 * | 6/2007 | del Mar Chamarro Marti | |
| | | | H03M 3/34 |
| | | | 341/143 |
| 8,068,047 B2 | 11/2011 | Kuramochi et al. | |
| 8,686,889 B2 * | 4/2014 | Reddy | H03M 1/1019 |
| | | | 250/208.1 |
| 8,947,280 B2 | 2/2015 | Wulff et al. | |
| 9,806,703 B2 | 10/2017 | Lin et al. | |
| 2017/0099035 A1 | 4/2017 | Park et al. | |

FOREIGN PATENT DOCUMENTS

| | | |
|---|---|---|
| JP | 2011147117 A | 7/2011 |
| JP | 2012186715 A | 9/2012 |
| TW | 1555341 B | 10/2016 |

* cited by examiner

ANALOG-TO-DIGITAL CONVERTER WITH NOISE ELIMINATION

CROSS REFERENCE TO RELATED APPLICATIONS

This application claims the benefit of U.S. Provisional Application No. 62/558,892 filed Sep. 15, 2017, the entirety of which is incorporated by reference herein.

BACKGROUND OF THE INVENTION

Field of the Invention

The present invention relates to analog-to-digital converters (ADCs).

Description of the Related Art

In electronics, an analog-to-digital converter is a system that converts an analog input into digital representation.

For analog-to-digital conversion in a differential architecture, a single-ended analog input has to be further inverted because a pair of differential analog signals is required for the analog-to-digital conversion. Typically, an input buffer is used for the inversion. However, the input buffer may result in noise problems due to circuit non-linearity, harmonic signals, and so on.

BRIEF SUMMARY OF THE INVENTION

An analog-to-digital converter with noise elimination in accordance with an exemplary embodiment is disclosed. The analog-to-digital converter converts a single-ended analog input into digital representation, and comprises an input buffer and an analog-to-digital conversion module. The input buffer outputs a positive differential signal and a negative differential signal based on the single-ended analog input. The analog-to-digital conversion module receives the positive differential signal and the negative differential signal to generate the digital representation. The input buffer further transmits a noise compensation signal to the analog-to-digital conversion module. The noise compensation signal contains noise information about noise transmitted from the input buffer to the analog-to-digital conversion module through the positive differential signal and the negative differential signal. The analog-to-digital conversion module uses the noise compensation signal to compensate for the noise transmitted from the input buffer to the analog-to-digital conversion module through the positive differential signal and the negative differential signal.

In an exemplary embodiment, the input buffer uses an operational amplifier to form a circuit for signal inversion. The noise compensation signal is retrieved from at least one virtual ground terminal of the circuit.

In an exemplary embodiment, the analog-to-digital conversion module has a comparator. The comparator uses the noise compensation signal to eliminate the noise transmitted from the input buffer to the analog-to-digital conversion module through the positive differential signal and the negative differential signal.

In an exemplary embodiment, the noise transmitted from the input buffer to the analog-to-digital conversion module through the positive differential signal and the negative differential signal is eliminated in an input stage of the comparator.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
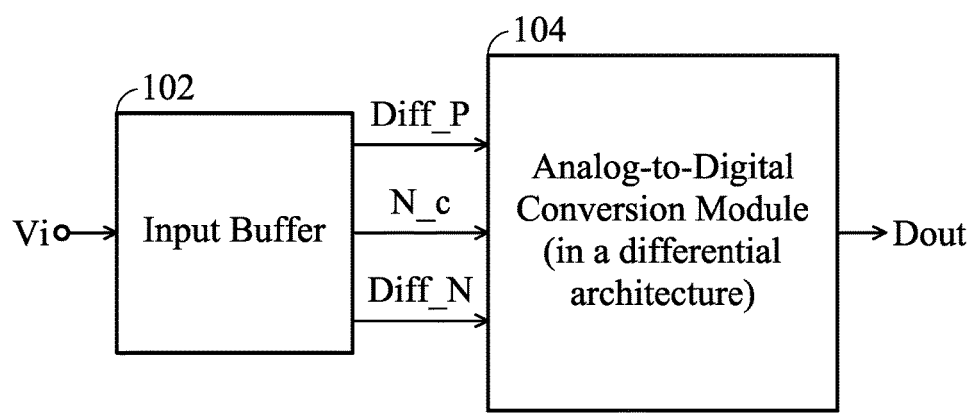
FIG. 1 depicts an analog-to-digital converter 100 in accordance with an exemplary embodiment of the disclosure.

FIG. 1 depicts an analog-to-digital converter 100 in accordance with an exemplary embodiment of the disclosure, which receives a single-ended analog input Vi and outputs digital representation Dout of the single-ended analog input Vi. The analog-to-digital converter 100 includes an input buffer 102 and an analog-to-digital conversion module 104. The analog-to-digital conversion module 104 is in a differential architecture. To provide the differential input that the analog-to-digital conversion module 104 requires, the input buffer 102 is designed to further process the single-ended analog input Vi. As shown, one pair of differential analog signals (a positive differential signal Diff_P and a negative differential signal Diff_N) is transmitted from the input buffer 102 to the analog-to-digital conversion module 104. Note that in addition to the pair of differential analog signals Diff_P and Diff_N, the input buffer 102 further provides a noise compensation signal N_c to the analog-to-digital conversion module 104. The noise compensation signal N_c is provided for the analog-to-digital conversion module 104 to eliminate the noise due to the input buffer 102. Accurate digital representation Dout of the single-ended analog input Vi, therefore, is generated.

The input buffer 102 may cause noise, due to circuit non-linearity, harmonic signals, and so on, and the noise is transmitted to the analog-to-digital conversion module 104 by the pair of differential analog signals Diff_P and Diff_N. The noise compensation signal N_c is retrieved from a circuit within the input buffer 102, wherein the noise of the input buffer 102 is also reflected on the signal retrieving terminal(s). Based on the noise information obtained from the noise compensation signal N_c, the analog-to-digital conversion module 104 compensates for the noise transmitted from the input buffer 102 through the pair of differential analog signals Diff_P and Diff_N. Thus, the digital representation Dout estimated by the analog-to-digital conversion module 104 is protected from being affected by the noise transmitted from the input buffer 102 through the pair of differential analog signals Diff_P and Diff_N and, therefore, is very accurate.

In some exemplary embodiments, the input buffer 102 uses an operational amplifier to implement signal inversion. The noise compensation signal N_c is retrieved from at least one virtual ground terminal of a circuit that uses the operational amplifier. In some exemplary embodiments, the circuit architecture of the analog-to-digital conversion module 104 includes a comparator. Different from the conventional techniques wherein a comparator is used to measure the difference between the positive differential signal Diff_P and the negative differential signal Diff_N for the following estimation of the digital representation Dout, the comparator in the disclosure provides an additional path for the noise compensation signal N_c and uses the noise compensation signal N_c to eliminate the noise transmitted from the input buffer 102 through the pair of differential analog signals Diff_P and Diff_N. The noise may be eliminated in the input stage of the comparator. The comparing result made by the comparator, therefore, focuses on the signal portion contained in the pair of differential analog signals Diff_P and Diff_N and is not biased by the noise of the input buffer 102. The noise of the input buffer 102 is successfully eliminated by the comparator.

Figure 2:
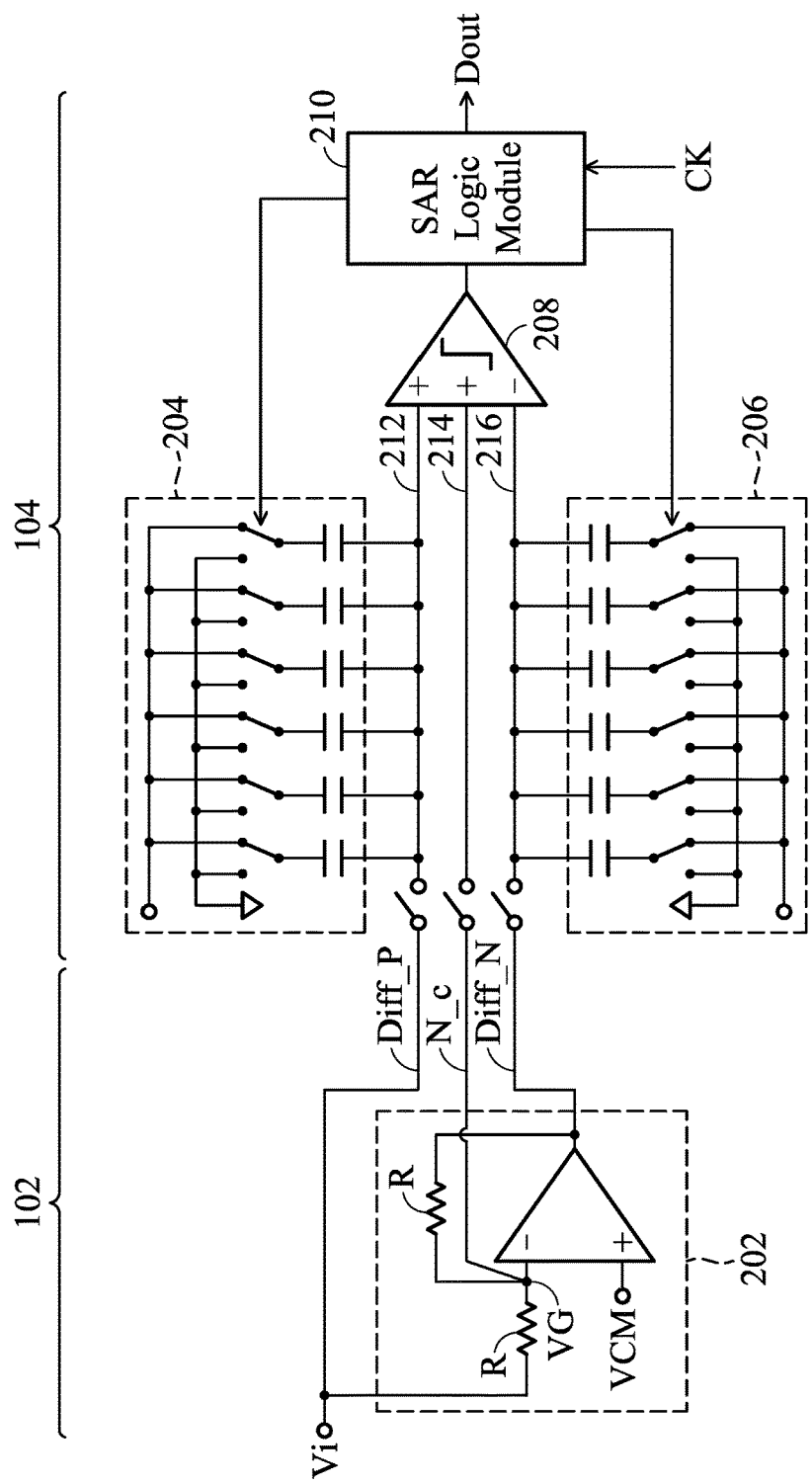
FIG. 2 details the input buffer 102 and the analog-to-digital conversion module 104 in accordance with an exemplary embodiment of the disclosure.

FIG. 2 details the input buffer 102 and the analog-to-digital conversion module 104 in accordance with an exemplary embodiment of the disclosure.

As shown, the single-ended analog input Vi is directly coupled to the analog-to-digital conversion module 104 as the positive differential signal Diff_P and an inverting amplifier 202 is provided within the input buffer 102 to convert the single-ended analog input Vi into the negative differential signal Diff_N. The noise compensation signal N_c is retrieved from a virtual ground terminal VG of the inverting amplifier 202. The positive differential signal Diff_P contains a signal portion VIP. The negative differential signal Diff_N contains a signal portion VIN and a noise portion VN. The noise compensation signal N_c contains VN/2, a half of the noise portion VN transmitted into the analog-to-digital conversion module 104 by the negative differential signal Diff_N. The noise compensation signal N_c containing VN/2 can be doubled to compensate for the noise portion VN of the negative differential signal Diff_N.

In FIG. 2, the analog-to-digital conversion module 104 uses a technology of successive approximation analog-to-digital conversion (SAR ADC). As shown, there are a weighted capacitor array 204, a weighted capacitor array 206, a comparator 208, and a successive approximation logic (SAR logic) module 210. The positive differential signal Diff_P and the negative differential signal Diff_N are sampled by the weighted capacitor array 204 and the weighted capacitor array 206, respectively. The sampled information is approximated from an MSB (most significant bit) to an LSB (least significant bit) in a successive approximation scheme. During the successive approximation scheme, the comparator 208 repeatedly works. According to each comparing result made by the comparator 208, the SAR logic module 210 determines a corresponding bit to form the digital representation Dout. The series of comparing results of the comparator 208 is also feedback by the SAR logic module 210 to control the weighted capacitor arrays 204 and 206. The control of each pair of switches provided within the weighted capacitor arrays 204 and 206 corresponds to one comparing result. During the successive approximation scheme, the multiple pairs of switches provided within the weighted capacitor arrays 204 and 206 are switched to the proper states in turn. Note that the comparator 208 is specially designed. By the comparator 208, the noise compensation signal N_c containing VN/2 is doubled and combined with the positive differential signal Diff_P sampled by the weighted capacitor array 204. The noise portion VN sampled by the weighted capacitor array 206 with the signal portion VIN within the negative differential signal Diff_N and coupled to the negative input terminal of the comparator 208, therefore, is compensated. The noise portion VN transmitted from the input buffer 102 to the analog-to-digital conversion module 104 by the negative differential signal Diff_N, therefore, is eliminated by the special design of the comparator 208. The digital representation Dout is perfectly estimated based on the signal portion VIP of the positive differential signal Diff_P and the signal portion VIN of the negative differential signal Diff_N without being affected by the noise transmitted from the input buffer 102. Accurate digital representation Dout of the single-ended analog input Vi, therefore, is generated.

Figure 3:
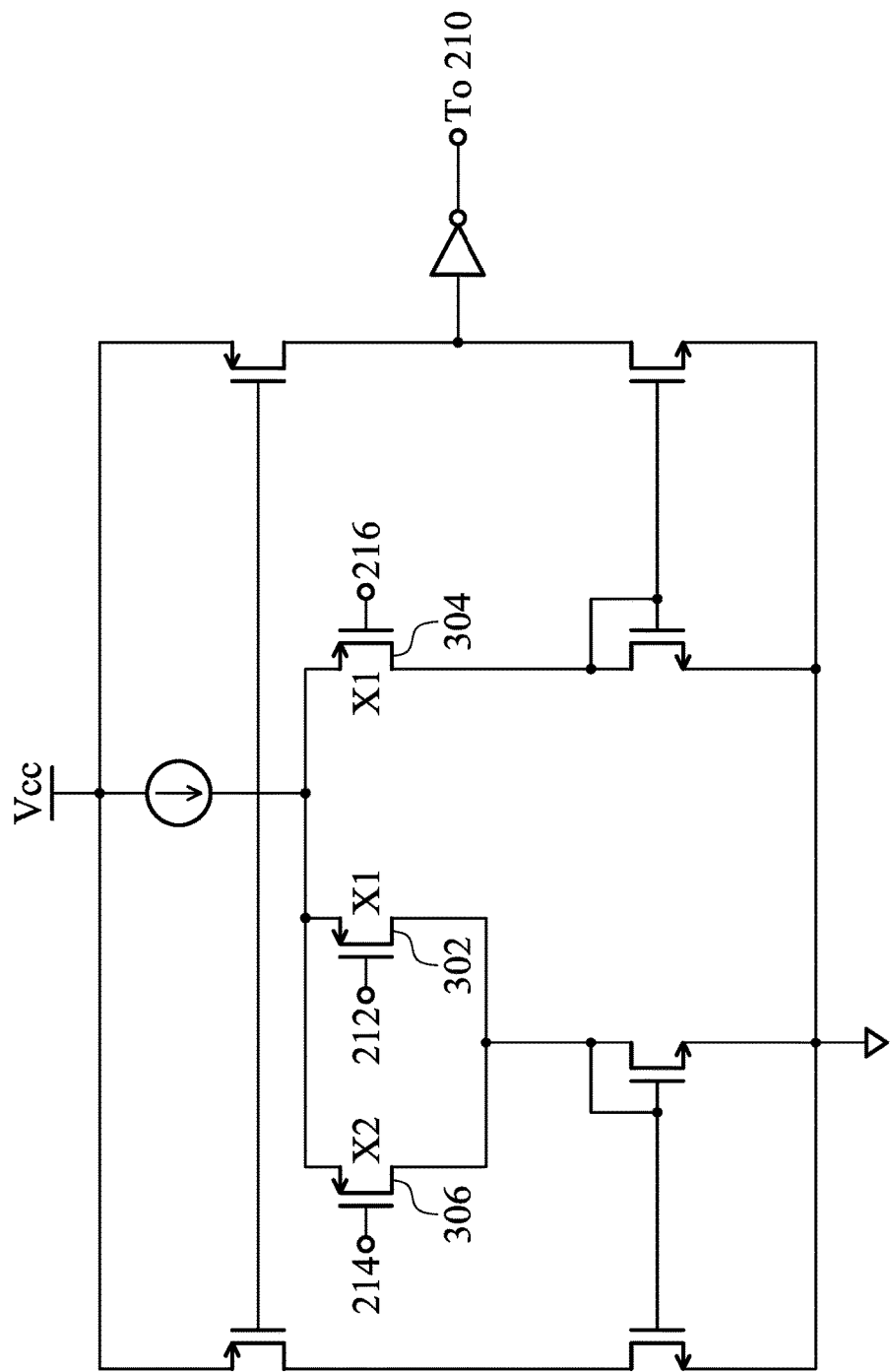
FIG. 3 details the comparator 208 in accordance with an exemplary embodiment of the disclosure.

As shown in FIG. 2, the specially designed comparator 208 has a positive differential input terminal ('+') 212 coupled to a common plate of the capacitors within the weighted capacitor array 204, another positive differential input terminal ('+') 214 receiving the sample of the noise compensation signal N_c, and a negative differential input terminal ('−') 216 coupled to the common plate of the capacitors within the weighted capacitor array 206. FIG. 3 details the comparator 208 in accordance with an exemplary embodiment of the disclosure. In comparison with the input MOS 304 corresponding to the negative differential input terminal ('−') 216, the input MOS 306 corresponding to the positive differential input terminal ('+') 214 is twice in size. In the comparator shown in FIG. 3, the input stage containing the input MOSs 302, 304 and 306 successfully eliminate the noise transmitted from the input buffer 102.

In some exemplary embodiments, the resistor ratio used in the inverting amplifier 202 is not 1:1. The noise compensation signal N_c retrieved from the virtual ground terminal VG contains another ratio of the noise portion VN transmitted into the analog-to-digital conversion module 104 by the negative differential signal Diff_N. The MOS size of the input MOS 306 of FIG. 3 should be adjusted accordingly.

Figure 4:
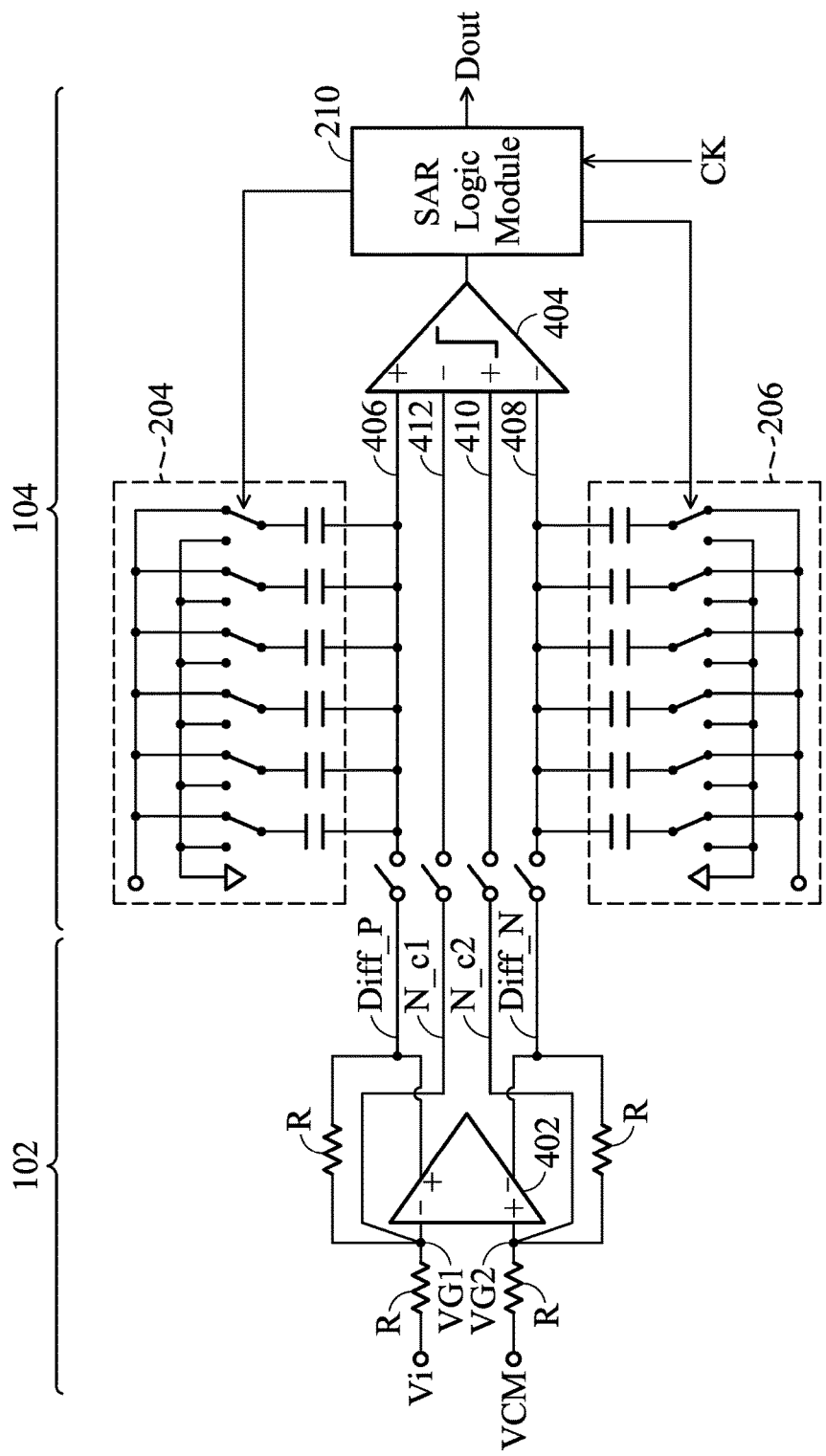
FIG. 4 details the input buffer 102 and the analog-to-digital conversion module 104 in accordance with another exemplary embodiment of the disclosure.

FIG. 4 details the input buffer 102 and the analog-to-digital conversion module 104 in accordance with another exemplary embodiment of the disclosure.

In FIG. 4, the input buffer 102 uses a differential-in and differential-out (DIDO) operational amplifier 402 to form a circuit that generates the pair of differential analog signals Diff_P and Diff_N based on the single-ended analog input Vi. Two virtual ground terminals VG1 and VG2 at the negative and positive differential input terminals ('−' and '+') of the operational amplifier 402 are further coupled to the analog-to-digital conversion module 104 to provide signals NC1 and NC2 which form the noise compensation signal N_c of FIG. 1. As shown, the negative differential input terminal '−' of the operational amplifier 402 is regarded as the ground terminal VG1 for providing the signal NC1, and the positive differential input terminal '+' of the operational amplifier 402 is regarded as the ground terminal VG2 for providing the signal NC2. The positive differential signal Diff_P contains a signal portion VIP and a noise portion VIP_N. The negative differential signal Diff_N contains a signal portion VIN and a noise portion VIN_N. The signal NC1 contains VIP_N/2, a half of the noise portion VIP_N transmitted into the analog-to-digital conversion module 104 by the positive differential signal Diff_P. The signal NC2 contains VIN_N/2, a half of the noise portion VIN_N transmitted into the analog-to-digital conversion module 104 by the negative differential signal Diff_N. The signal NC1 containing VIP_N/2 can be doubled to compensate for the noise portion VIP_N of the positive differential signal Diff_P. The signal NC2 containing VIN_N/2 can be doubled to compensate for the noise portion VIN_N of the negative differential signal Diff_N.

In FIG. 4, the analog-to-digital conversion module 104 uses a technology of successive approximation analog-to-digital conversion (SAR ADC) similar to the SAR ADC used in FIG. 2. Some modifications are made on the comparator 208 to provide the comparator 404 of FIG. 4. The comparator 404 has a first pair of differential input terminals 406 ('+') and 408 ('−') and a second pair of differential input terminals 410 ('+') and 412 ('−'). Referring to the first pair of differential input terminals 406 ('+') and 408 ('−'), the positive differential input terminal 406 ('+') is coupled to the common plate of the capacitors within the weighted capacitor array 204 and the negative differential input terminal 408 ('−') is coupled to the common plate of the capacitors within the weighted capacitor array 206. Referring to the second pair of differential input terminals 410 ('+') and 412 ('−'), the positive differential input terminal 410 ('+') receives the sample of the signal NC2 and the negative differential input terminal 412 ('−') receives the sample of the signal NC1. By the comparator 404, the signal NC2 containing VIN_N/2 is doubled and combined with the positive differential signal Diff_P sampled by the weighted capacitor array 204 (forming 2*(VIN_N/2)+VIP+VIP_N), and the signal NC1 containing VIP_N/2 is doubled and combined with the negative differential signal Diff_N sampled by the weighted capacitor array 206 (forming 2*(VIP_N/2)+VIN+VIN_N). The comparator 404 estimates the difference between the two combined signals. A calculation, (2*(VIN_N/2)+VIP+VIP_N)−(2*(VIP_N/2)+VIN+VIN_N), is performed and thereby the noise portions VIP_N and VIN_N are perfectly eliminated. The digital representation Dout, therefore, is estimated based on the signal portion VIP of the positive differential signal Diff_P and the signal portion VIN of the negative differential signal Diff_N without being affected by the noise transmitted from the input buffer 102. Accurate digital representation Dout of the single-ended analog input Vi is generated.

Figure 5:
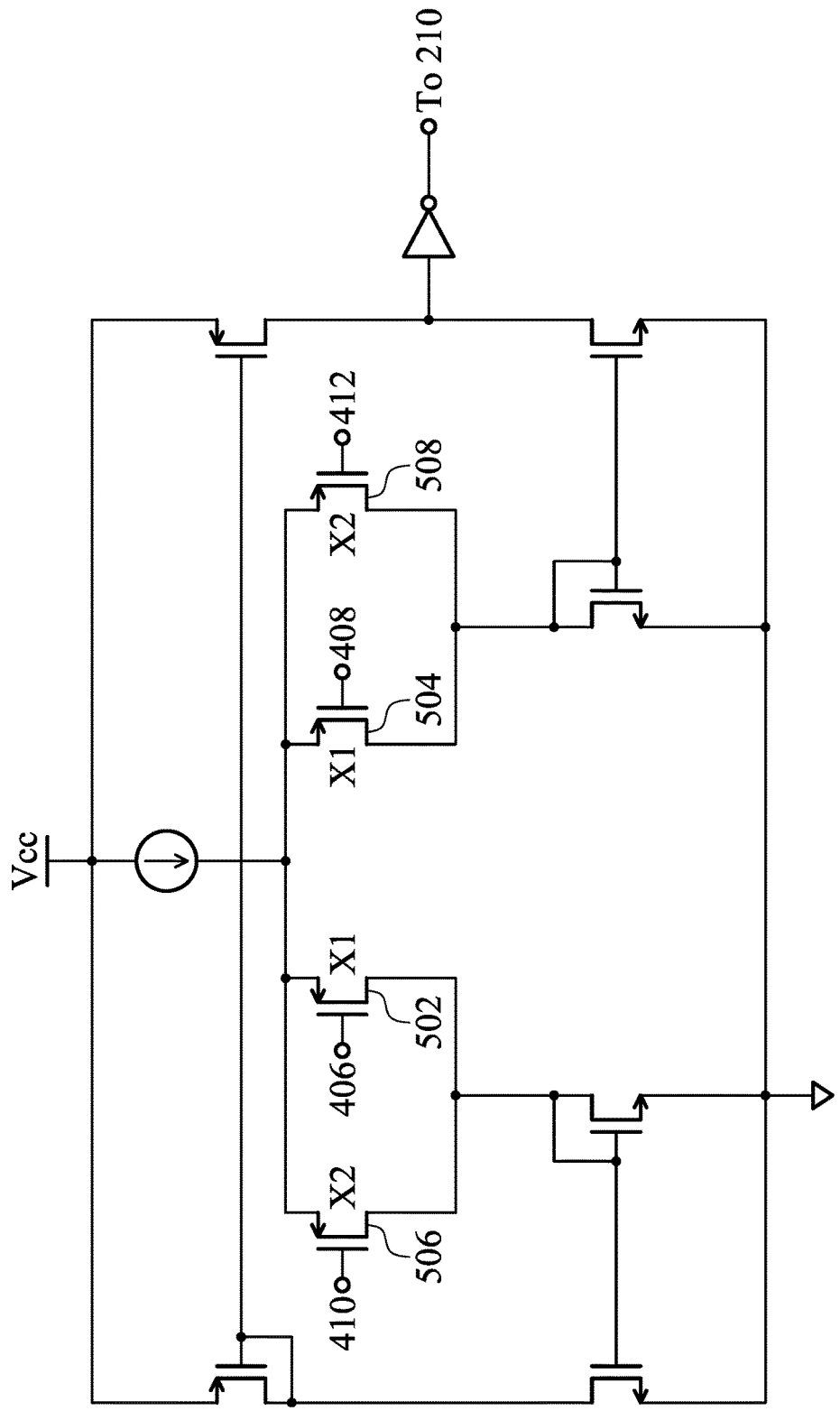
FIG. 5 details the comparator 404 in accordance with an exemplary embodiment of the disclosure.

FIG. 5 details the comparator 404 in accordance with an exemplary embodiment of the disclosure. In comparison with the input MOS 502 corresponding to the positive differential input terminal ('+') 406 and the input MOS 504 corresponding to the negative differential input terminal ('−') 408, the input MOS 506 corresponding to the positive differential input terminal ('+') 410 and the input MOS 508 corresponding to the negative differential input terminal ('−') 412 are twice in size. In the comparator shown in FIG. 5, the input stage containing the input MOSs 502, 504, 506 and 508 successfully eliminate the noise transmitted from the input buffer 102.

In some exemplary embodiments, the resistor ratio used in the input buffer 102 of FIG. 4 for generation of the pair of differential analog signals Diff_P and Diff_N is not 1:1. The signal NC1 retrieved from the virtual ground terminal VG1 contains another ratio for the noise portion VIP_N, and the signal NC2 retrieved from the virtual ground terminal VG2 contains another ratio for the noise portion VIN_N. The MOS size of the input MOSs 506 and 508 of FIG. 5 should be adjusted accordingly.

In some exemplary embodiments, the analog-to-digital conversion module 104 may perform delta-sigma modulation. Instead of the comparator 208 or 404, an operational amplifier in the delta-sigma modulation ADC is used to receive the noise compensation signal N_c and use the noise compensation signal N_c to eliminate the noise transmitted from the input buffer 102 through the pair of differential analog signals Diff_P and Diff_N. The noise of the input buffer 102 can be also successfully eliminated by the operational amplifier in the delta-sigma modulation ADC.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An analog-to-digital converter converting a single-ended analog input into digital representation, comprising:
   an input buffer, outputting a positive differential signal and a negative differential signal based on the single-ended analog input; and
   an analog-to-digital conversion module, receiving the positive differential signal and the negative differential signal to generate the digital representation,
   wherein:
   the input buffer further transmits a noise compensation signal to the analog-to-digital conversion module;
   the input buffer further comprises an operational amplifier to form a circuit for signal inversion; and
   the noise compensation signal is retrieved from at least one virtual ground terminal of the circuit.

2. The analog-to-digital converter as claimed in claim 1, wherein:
   the analog-to-digital conversion module comprises a comparator; and
   the comparator uses the noise compensation signal to eliminate the noise transmitted from the input buffer to the analog-to-digital conversion module through the positive differential signal and the negative differential signal.

3. The analog-to-digital converter as claimed in claim 2, wherein:
   the noise transmitted from the input buffer to the analog-to-digital conversion module through the positive differential signal and the negative differential signal is eliminated in an input stage of the comparator.

4. The analog-to-digital converter as claimed in claim 1, wherein:
   the analog-to-digital conversion module performs delta-sigma modulation;
   an operational amplifier provided within the analog-to-digital conversion module for the delta-sigma modulation further uses the noise compensation signal to eliminate the noise transmitted from the input buffer to the analog-to-digital conversion module through the positive differential signal and the negative differential signal.

5. An analog-to-digital converter converting a single-ended analog input into digital representation, comprising:
   an input buffer, outputting a positive differential signal and a negative differential signal based on the single-ended analog input; and
   an analog-to-digital conversion module, receiving the positive differential signal and the negative differential signal to generate the digital representation, wherein:
the input buffer further transmits a noise compensation signal to the analog-to-digital conversion module;
the input buffer includes an inverting amplifier converting the single-ended analog input into the negative differential signal; and
the noise compensation signal is retrieved from a virtual ground terminal of the inverting amplifier.

6. The analog-to-digital converter as claimed in claim 5, wherein:
the analog-to-digital conversion module performs successive approximation analog-to-digital conversion which uses a comparator; and
the comparator uses the noise compensation signal to eliminate the noise transmitted from the input buffer to the analog-to-digital conversion module through the negative differential signal.

7. The analog-to-digital converter as claimed in claim 6, wherein:
the noise transmitted from the input buffer to the analog-to-digital conversion module through the negative differential signal is eliminated by the noise compensation signal in an input stage of the comparator.

8. The analog-to-digital converter as claimed in claim 5, wherein:
the analog-to-digital conversion module performs successive approximation analog-to-digital conversion and has a first weighted capacitor array, a second weighted capacitor array, a comparator, and a successive approximation logic module;
the positive differential signal and the negative differential signal are sampled by the first weighted capacitor array and the second weighted capacitor array, respectively;
the comparator has a first positive differential input terminal coupled to a common plate of a plurality of capacitors within the first weighted capacitor array, a second positive differential input terminal coupled to the virtual ground terminal of the inverting amplifier of the input amplifier, and a negative differential input terminal coupled to a common plate of a plurality of capacitors within the second weighted capacitor array;
an output terminal of the comparator is coupled to the successive approximation logic module; and
the successive approximation logic module generates the digital representation and controls the first and second weighted capacitor arrays in a successive approximation scheme.

9. The analog-to-digital converter as claimed in claim 8, wherein:
the comparator has a first input MOS corresponding to the first positive differential input terminal, a second input MOS corresponding to the second positive differential input terminal, and a third input MOS corresponding to the negative differential input terminal; and
the MOS size of the second input MOS and the MOS size of the third input MOS are in a specific ratio that depends on the ratio of the noise portion of the negative differential signal reflected at the virtual ground terminal of the inverting amplifier of the input amplifier.

10. An analog-to-digital converter converting a single-ended analog input into digital representation, comprising:
an input buffer, outputting a positive differential signal and a negative differential signal based on the single-ended analog input; and
an analog-to-digital conversion module, receiving the positive differential signal and the negative differential signal to generate the digital representation, wherein:
the input buffer further transmits a noise compensation signal to the analog-to-digital conversion module;
the input buffer includes a differential-in and differential-out operational amplifier to form a circuit that generates the positive differential signal and the negative differential signal based on the single-ended analog input; and
a first virtual ground terminal at a negative differential input terminal of the differential-in and differential-out operational amplifier and a second virtual ground terminal at a positive differential input terminal of the differential-in and differential-out operational amplifier are coupled to the analog-to-digital conversion module to provide the analog-to-digital conversion module with the noise compensation signal.

11. The analog-to-digital converter as claimed in claim 10, wherein:
the analog-to-digital conversion module performs successive approximation analog-to-digital conversion which uses a comparator; and
the comparator uses the noise compensation signal to eliminate the noise transmitted from the input buffer to the analog-to-digital conversion module through the positive differential signal and the negative differential signal.

12. The analog-to-digital converter as claimed in claim 11, wherein:
the noise transmitted from the input buffer to the analog-to-digital conversion module through the positive and negative differential signals is eliminated by the noise compensation signal in an input stage of the comparator.

13. The analog-to-digital converter as claimed in claim 10, wherein:
the analog-to-digital conversion module performs successive approximation analog-to-digital conversion and has a first weighted capacitor array, a second weighted capacitor array, a comparator, and a successive approximation logic module;
the positive differential signal and the negative differential signal are sampled by the first weighted capacitor array and the second weighted capacitor array, respectively;
the comparator has a first positive differential input terminal coupled to a common plate of a plurality of capacitors within the first weighted capacitor array, a first negative differential input terminal coupled to a common plate of a plurality of capacitors within the second weighted capacitor array, a second positive differential input terminal coupled to the second virtual ground terminal, and a second negative differential input terminal coupled to the first virtual ground terminal;
an output terminal of the comparator is coupled to the successive approximation logic module; and
the successive approximation logic module generates the digital representation and controls the first and second weighted capacitor arrays in a successive approximation scheme.

14. The analog-to-digital converter as claimed in claim 13, wherein:
the comparator has a first input MOS corresponding to the first positive differential input terminal, a second input MOS corresponding to the first negative differential input terminal, a third input MOS corresponding to the second positive differential input terminal, and a fourth input MOS corresponding to the second negative differential input terminal;

the MOS size of the fourth input MOS and the MOS size of the first input MOS are in a specific ratio that depends on the ratio of the noise portion of the positive differential signal reflected at the first virtual ground terminal; and the MOS size of the third input MOS and the MOS size of the second input MOS are in a specific ratio that depends on the ratio of the noise portion of the negative differential signal reflected at the second virtual ground terminal.

15. The analog-to-digital converter as claimed in claim 1, wherein:

the noise compensation signal contains noise information about noise transmitted from the input buffer to the analog-to-digital conversion module through the positive differential signal and the negative differential signal; and the analog-to-digital conversion module uses the noise compensation signal to compensate for the noise transmitted from the input buffer to the analog-to-digital conversion module through the positive differential signal and the negative differential signal.

16. The analog-to-digital converter as claimed in claim 5, wherein:

the noise compensation signal contains noise information about noise transmitted from the input buffer to the analog-to-digital conversion module through the positive differential signal and the negative differential signal; and the analog-to-digital conversion module uses the noise compensation signal to compensate for the noise transmitted from the input buffer to the analog-to-digital conversion module through the positive differential signal and the negative differential signal.

17. The analog-to-digital converter as claimed in claim 10, wherein:

the noise compensation signal contains noise information about noise transmitted from the input buffer to the analog-to-digital conversion module through the positive differential signal and the negative differential signal; and the analog-to-digital conversion module uses the noise compensation signal to compensate for the noise transmitted from the input buffer to the analog-to-digital conversion module through the positive differential signal and the negative differential signal.

* * * * *